United States Patent
Sha et al.

(10) Patent No.: US 11,677,148 B2
(45) Date of Patent: Jun. 13, 2023

(54) ELECTRONIC DEVICE

(71) Applicant: BEIJING XIAOMI MOBILE SOFTWARE CO., LTD., Beijing (CN)

(72) Inventors: Shaoshu Sha, Beijing (CN); Qing Wu, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 184 days.

(21) Appl. No.: 17/204,205

(22) Filed: Mar. 17, 2021

(65) Prior Publication Data
US 2022/0013907 A1      Jan. 13, 2022

(30) Foreign Application Priority Data
Jul. 8, 2020   (CN) .......................... 202010653238.X

(51) Int. Cl.
  *H01Q 5/314*   (2015.01)
  *H01Q 1/22*    (2006.01)
  *H03H 7/38*    (2006.01)

(52) U.S. Cl.
  CPC .............. *H01Q 5/314* (2015.01); *H01Q 1/22* (2013.01); *H03H 7/38* (2013.01)

(58) Field of Classification Search
  CPC ............. H01Q 5/314; H01Q 1/22; H03H 7/38
  USPC ......................................................... 343/702
  See application file for complete search history.

(56) References Cited

U.S. PATENT DOCUMENTS

| 2004/0075613 A1* | 4/2004 | Jarmuszewski | H01Q 9/42 |
| | | | 343/702 |
| 2014/0266922 A1* | 9/2014 | Jin | H01Q 1/243 |
| | | | 343/702 |
| 2015/0380355 A1* | 12/2015 | Rogers | H01L 23/5387 |
| | | | 257/773 |
| 2017/0338546 A1* | 11/2017 | Wong | H01Q 7/00 |

(Continued)

FOREIGN PATENT DOCUMENTS

| CN | 105514624 B | 6/2018 |
| CN | 109193129 A | 1/2019 |

(Continued)

OTHER PUBLICATIONS

Japanese Patent Application No. 2021-051703, Office Action dated Feb. 22, 2022, 4 pages.

(Continued)

*Primary Examiner* — Hai V Tran
(74) *Attorney, Agent, or Firm* — Cozen O'Connor

(57) ABSTRACT

The present disclosure provides an electronic device including a metal housing and a plurality of antennas operating at different frequency bands. A frame of the metal housing is provided with at least one gap, each frame segment of frame segments on both sides of each gap is configured as a radiation structure shared by at least one antenna. Each antenna includes a signal circuit and a matching circuit, the matching circuit is coupled in series between the signal circuit of the antenna where the matching circuit is located and the radiation structure, and configured to output a signal matching with an operating frequency band of the antenna where the matching circuit is located and filter out signals that are coupled from other antennas of the gap and match with operating frequency bands of other antennas of the gap.

14 Claims, 5 Drawing Sheets

(56) References Cited

U.S. PATENT DOCUMENTS

2018/0183137 A1\* 6/2018 Tsai .................. H01Q 5/335
2019/0386379 A1   12/2019 Kuo et al.

FOREIGN PATENT DOCUMENTS

| CN | 210182568 U  | 3/2020 |
| CN | 111193100 A  | 5/2020 |
| JP | 2011049847 A | 3/2011 |

OTHER PUBLICATIONS

Japanese Patent Application No. 2021-051703, English translation of Office Action dated Feb. 22, 2022, 4 pages.
European Application 21165894.3 Search Report and Opinion, dated Sep. 29, 2021, 13 pages.

\* cited by examiner

ELECTRONIC DEVICE

CROSS REFERENCE TO RELATED APPLICATION

This application is based on and claims priority to Chinese patent application No. 202010653238.X, filed on Jul. 8, 2020, the entire content of which is hereby incorporated into this application by reference.

FIELD

The present disclosure relates to a technology field of antennas, and more particularly, to an electronic device.

BACKGROUND

With development of 5G communication technologies, electronic devices need to incorporate more antennas to achieve 2/3/4/5G communication capability. Taking an electronic device having metal frames as an example, bandwidth and efficiency of antennas based on the frames tend to exceed those of built-in antennas made by printing direct structuring (PDS), laser direct structuring (LDS) and flexible printed circuit (FPC).

SUMMARY

The present disclosure provides an electronic device to address deficiencies of related technologies.

According to a first aspect of embodiments of the present disclosure, an electronic device is provided. The electronic device includes a metal housing and a plurality of antennas operating at different frequency bands. A frame of the metal housing is provided with at least one gap, each frame segment of frame segments on both sides of each gap is configured as a radiation structure shared by at least one antenna. Each antenna includes a signal circuit and a matching circuit, the matching circuit is coupled in series between the signal circuit of the antenna where the matching circuit is located and the radiation structure, and configured to output a signal matching with an operating frequency band of the antenna where the matching circuit is located and filter out signals that are coupled from other antennas of the gap and match with operating frequency bands of other antennas of the gap.

It should be understood that above general description and following detailed description are only exemplary and explanatory, but do not limit the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Descriptions will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of devices and methods consistent with aspects related to the disclosure as recited in the appended claims.

In practical terms, when frames of electronic devices are provided with gaps to form antennas with different frequency bands for operating, with increasing of the number of the antennas, the number of the gaps also increases, which affects strength of metal structures and does not meet requirements of industrial design for appearance.

Figure 1:
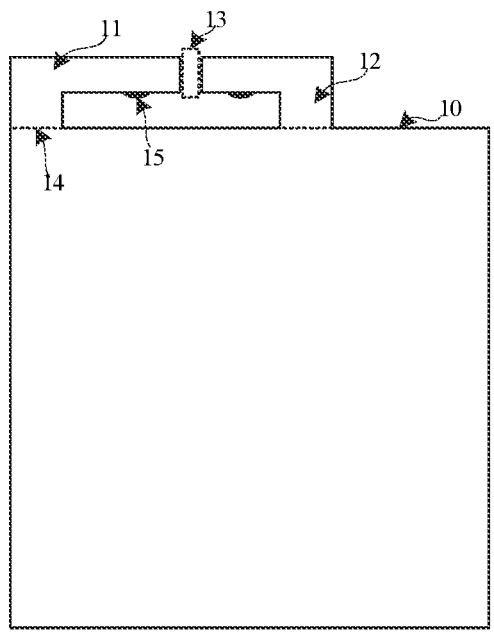
FIG. 1 is a schematic diagram illustrating a structure of an electronic device according to an exemplary embodiment.

In order to address the above technical problems, embodiments of the present disclosure provide an electronic device. The electronic device includes a metal housing and a plurality of antennas operating at different frequency bands. A frame of the metal housing is provided with at least one gap. Each frame segment of frame segments on both sides of each gap is configured as a radiation structure shared by at least one antenna. FIG. 1 is a schematic diagram illustrating a structure of an electronic device according to an exemplary embodiment. Referring to FIG. 1, the metal housing 10 includes a first frame segment 11 and a second frame segment 12 each bending upwards along a dashed line 14, each bending frame segment is perpendicular to the lower housing portion. The bending upwards may refer to bending towards a direction perpendicular to the paper. For ease of understanding, the metal housing is expanded to form a metal plane in FIG. 1. The gap 13 is formed between the first frame segment 11 and the second frame segment 12. Each of the first frame segment 11 and the second frame segment 12 of frame segments on both sides of the gap 13 is configured as the radiation structure shared by the at least one antenna. Thus, in this embodiment, at least two antennas may be arranged on both sides of each gap, which may reduce the number of gaps on the frame, improve use efficiency of each gap, help to ensure strength of the metal structure, and also help to meet industrial design requirements for appearance.

It should be noted that, considering that the at least two antennas may be arranged on both sides of each slot for the metal housing, an arranging principle of the antennas on both sides of each slot is the same as that of the antennas on both sides of the slot 13, except for having a distinction with different operating frequencies. Therefore, FIG. 1 only illustrates the gap 13 which one of the at least one gap in the metal housing, and in the following embodiments, the gap 13 is also as an example to describe the structure or function of each gap.

Figure 2:
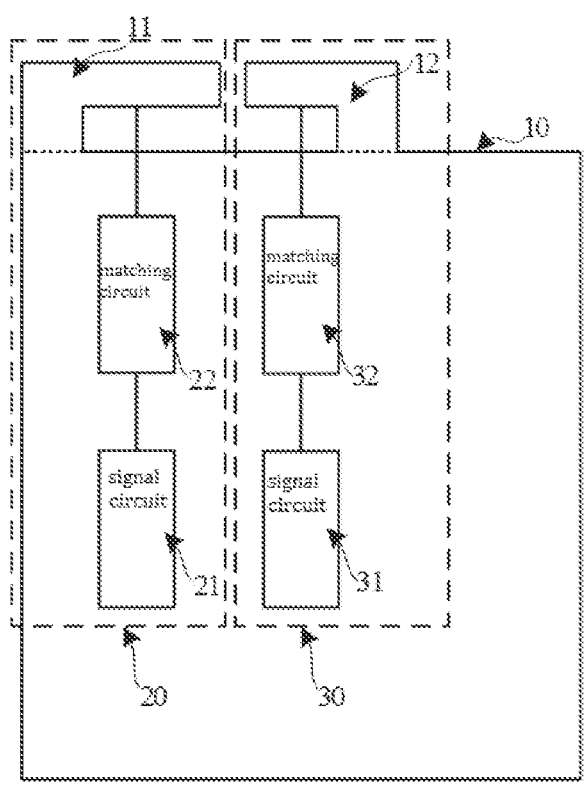
FIG. 2 is a block diagram illustrating an antenna according to an exemplary embodiment.

In this embodiment, each antenna in the plurality of antennas includes a signal circuit and a matching circuit. The matching circuit is coupled in series between the signal circuit of the antenna where the matching circuit is located and the radiation structure. Considering that the antennas on both sides of each gap will have signal coupling, the matching circuit of each antenna has the following functions: 1) outputting a signal matching with an operating frequency band of the antenna where the matching circuit is located; 2) filtering out that are coupled from other antennas of the gap and match with operating frequency bands of other antennas of the gap. The operating frequency band of the antenna may refer to the frequency band at which the antenna operates. FIG. 2 is a schematic diagram illustrating one antenna being arranged on each side of a gap according to an exemplary embodiment. Referring to FIG. 2, a first antenna 20 includes a signal circuit 21 and a matching circuit 22. The matching circuit 22 is coupled in series between the signal circuit 21 and the first frame segment 11. The matching circuit 22 is configured to output a signal matching with a first operating frequency band of the first antenna 20 and filter out signals that are coupled from a second antenna 30 of the gap 13 and match with a second operating frequency band of a second antenna 30. The signal circuit 21 is configured to provide a source signal, the source signal is passed through the matching circuit 22 and then forms an electromagnetic signal to radiate into space through the radiation structure; or, the radiation structure receives the electromagnetic signal in the space to obtain an electrical signal, the electrical signal is matched by the matching circuit 22 and then transmitted to the signal circuit 21 and processed by the signal circuit 21 to obtain a signal contained in the electromagnetic signal.

Continuing to refer to FIG. 2, the second antenna 30 includes a signal circuit 31 and a matching circuit 32. The matching circuit 32 is coupled in series between the second frame segment 12 and the signal circuit 31. The matching circuit 32 is configured to output a signal matching with the second operating frequency band of the second antenna 30 and filter out signals that are coupled from the first antenna 20 of the gap 13 and match with the first operating frequency band of the first antenna 20. Functions of the signal circuit 31 may refer to the description of the signal circuit 21, which will not be repeated here.

It should be noted that in practical terms, the radiation structures of the first antenna 20 and the second antenna 30 may also couple other signals in the space. Since strength of signals coupled from other signals is much smaller than strength of the signal coupled from the opposite antenna, the signals coupled from other signals may be ignore.

In an embodiment, the matching circuit of each antenna in the electronic device is electrically contacted with the frame as the radiation structure. In detail, manners such as welding, elastic connection, plugging connection and bolting may be used and set according to specific scenarios. For example, considering manufacturing technologies of the electronic device, the metal housing of the electronic device may be produced alone. In this case, the matching circuit may be elastically contacted with the frame through an elastic sheet to form the electrical connection. For example, the first frame segment 11 and the second frame segment 12 on both sides of the gap 13 may be provided with electrical contact points 15, and the number of the electrical contact points 15 may be the same with the number of antennas sharing the frame segment as the radiation structure. For example, when the first frame segment 11 is used as the radiation structure of one antenna, the number of the electrical contact point 15 on the first frame segment 11 may be one; when the first frame segment 11 is used as the radiating structure shared by two antennas, the number of the electrical contact points 15 on the first frame segment 11 may be two, and so on.

Continuing to refer to FIG. 1, length of the first frame segment 11 is greater than length of the second frame segment 12. Therefore, an operating frequency of the second antenna 30 exceeds an operating frequency of the first antenna 20. In an example, the first antenna 20 may operate at the following frequency bands, such as B1/3/7 (1710 MHz~2690 MHz), or GPS (1575.42 MHz)+2.4G WiFi (2.4 GHz~2.5 GHz). The second antenna 30 may operate at the following frequency bands, such as N78 (3300 MHz~3800 MHz), N79 (4400 MHz~4900 MHz) or WiFi 5G (550 MHz~850 MHz). The operating frequency band of the first antenna 20 and the operating frequency band of the second antenna 30 may be adjusted according to the gap and usage scenarios, which is not limited here.

Figure 3:
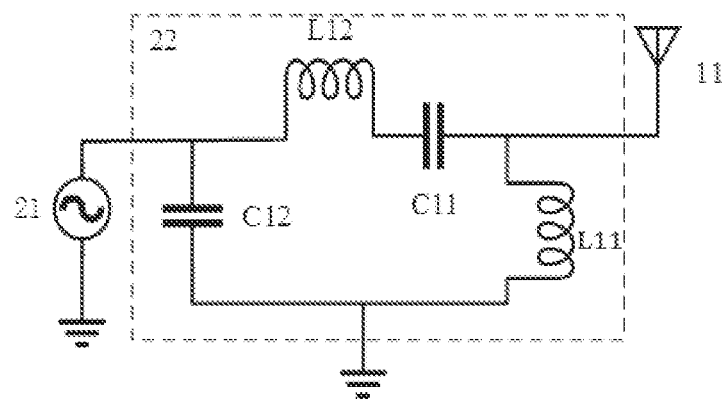
FIG. 3 is a schematic diagram illustrating a matching circuit applicable for a first antenna according to an exemplary embodiment.

In an embodiment, the matching circuit of the first antenna includes a first inductor, a second inductor, a first capacitor and a second capacitor. The first inductor is coupled in series between a first terminal of the matching circuit of the first antenna and ground; the second capacitor is coupled in series between a second terminal of the matching circuit of the first antenna and the ground; the first capacitor is coupled in series between the first terminal of the matching circuit of the first antenna and one terminal of the second inductor, and the other terminal of the second inductor is electrically coupled to the second terminal of the matching circuit of the first antenna. The matching circuit of the second antenna includes a third inductor, a fourth inductor, a third capacitor and a fourth capacitor. The third inductor is coupled in series between the first terminal of the matching circuit of the second antenna and the ground; the fourth capacitor is coupled in series between the second terminal of the matching circuit of the second antenna and the ground; the third capacitor is coupled in series between the first terminal of the matching circuit of the second antenna and one terminal of the fourth inductor, and the other terminal of the fourth inductor is electrically coupled to the second terminal of the matching circuit of the second antenna. In an example, referring to FIG. 3, the matching circuit 22 includes a first inductor L11, a second inductor L12, a first capacitor C11 and a second capacitor C12. The first inductor L11 is coupled in series between the first terminal of the matching circuit 22 of the first antenna 20 (that is, a terminal electrically coupled to the first frame segment 11) and ground; the second capacitor C12 is coupled in series between a second terminal of the matching circuit 22 of the first antenna 20 (that is, a terminal electrically coupled to the signal circuit 21) and the ground; the first capacitor C11 is coupled in series between the first terminal of the matching circuit 22 of the first antenna 20 and one terminal of the second inductor L12, and the other terminal of the second inductor L12 is electrically coupled to the second terminal of the matching circuit 22 of the first antenna 20.

In an example, values of the second inductor L12 and the second capacitor C12 in the first antenna 20 are as follows. Taking the first antenna 20 operating at the frequency band of B1/3/7 as an example, an inductance value of the second inductor L12 is greater than 8 nH, and a capacitance value of the second capacitor L12 is greater than 1 pF. Taking the first antenna 20 operating at the frequency band of GPS+ WiFi 2.4G as an example, the inductance value of the second inductor L12 is greater than 5 nH, and the capacitance value of the second capacitor L12 is greater than 0.5 pF. It is understandable that those skilled in the art may set the values of the second inductor L12 and the second capacitor C12 in the first antenna 20 according to the frequency range of the first frequency band in a specific scenario. In this example, with a large inductor (L12) being coupled in series in the matching circuit 22, the signal with the first frequency band obtained by the radiation structure may be allowed to pass, and the coupled signal with the second frequency band may be stopped. If there is still the coupled signal with the second frequency band passing, the coupled signal with the second frequency band may be coupled to the ground by a parallel large capacitor (C12), which may achieve low-pass filtering, and achieve an effect of preventing the signal with the second frequency band from inputting the signal circuit 21. The effect is illustrated as a curve 22 in FIG. 5.

Figure 4:
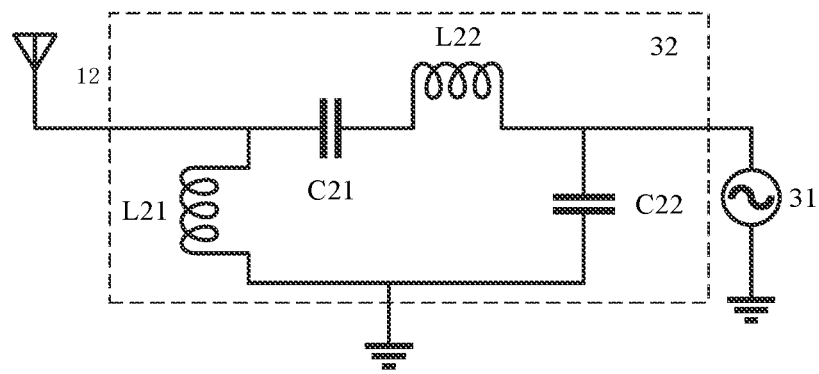
FIG. 4 is a schematic diagram illustrating a matching circuit applicable for a second antenna according to an exemplary embodiment.

Referring to FIG. 4, the matching circuit 32 includes a third inductor L21, a fourth inductor L22, a third capacitor C21 and a fourth capacitor C22. The third inductor L21 is coupled in series between the first terminal of the matching circuit 32 of the second antenna 30 and the ground; the fourth capacitor C22 is coupled in series between the second terminal of the matching circuit 32 of the second antenna 30 and the ground; the third capacitor C21 is coupled in series between the first terminal of the matching circuit 32 of the second antenna 30 and one terminal of the fourth inductor L22, and the other terminal of the fourth inductor L22 is electrically coupled to the second terminal of the matching circuit 32 of the second antenna 30.

In an example, values of the third inductor L21 and the third capacitor C21 in the second antenna 30 are as follows. Taking the second antenna 30 operating at the frequency band of N78/N79 as an example, an inductance value of the third inductor L21 is less than 3 nH, and a capacitance value of the third capacitor C21 is less than 1 pF. Taking the first antenna 20 operating at the frequency band of WiFi 5G as an example, the inductance value of the third inductor L21 is less than 3 nH, and the capacitance value of the third capacitor C21 is less than 1 pF. It is understandable that those skilled in the art may set the values of the third inductor L21 and the third capacitor C21 in the second antenna 30 according to the frequency range of the second frequency band in a specific scenario. In this example, with a small inductance (L21) being coupled in parallel in the matching circuit 32, the signal with the first frequency band may be coupled to the ground, and the signal with the second frequency band may be allowed to pass, which may achieve high-pass filtering, and achieve an effect of preventing the signal with the first frequency band from inputting the signal circuit 31. The effect is illustrated as a curve 32 in FIG. 5.

Figure 5:
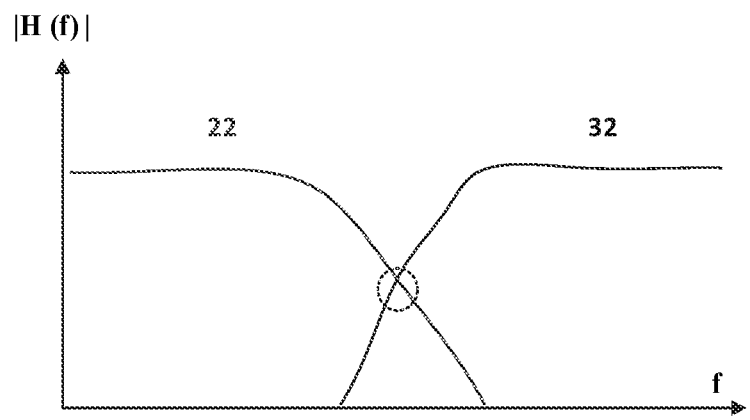
FIG. 5 is a schematic diagram illustrating curves of frequency responses of matching circuits according to an exemplary embodiment.
Figure 8:
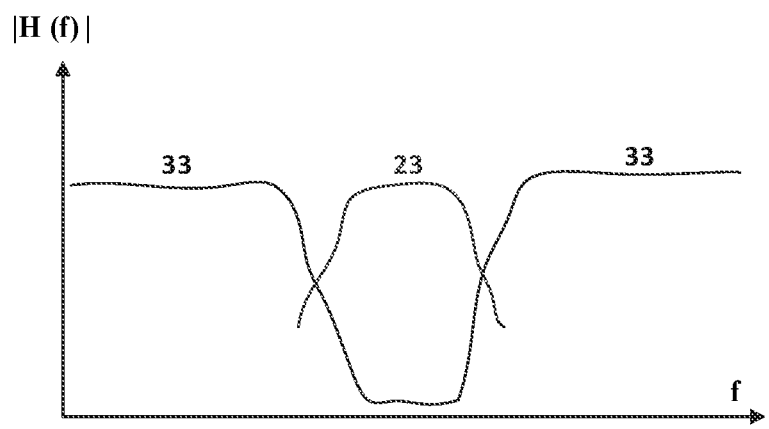
FIG. 8 is a schematic diagram illustrating curves of frequency responses of filter circuits according to an exemplary embodiment.

Continuing to refer to FIG. 5, isolation effect between the first antenna 20 and the second antenna 20 is not ideal near an intersection point of the curve 22 and the curve 32 (an inner area of a dashed circle). In order to further improve isolation degree between the first antenna and the second antenna, in an embodiment, each antenna further includes a filter circuit. The filter circuit is coupled in series between the matching circuit and the signal circuit of the antenna where the filter circuit is located, and configured to filter out signals that are coupled from the antenna on the other side of the same gap, and when there are other antennas on the same side with the antenna where the filter circuit is located sharing the frame segment, the signals of other antennas are also filtered out Referring to FIG. 6, the first antenna 20 includes a filter circuit 23, which may be a band-pass filter. The filter circuit 23 includes a capacitor C13 and an inductor L13. The capacitor C13 is coupled in series between the second terminal of the matching circuit 22 and one terminal of the inductor L13, and the other terminal of the inductor L13 is grounded, which may form a series LC resonant circuit. When a capacitance value of the capacitor C13 is less than 0.3 pF and the inductance value of the inductor L13 is greater than 9 nH, a resonant frequency of the series LC resonant circuit is 3.3 GHz. At the resonant frequency, the series LC resonant circuit is equivalent to a short circuit, and the signal coupled from the second antenna 30 may be short-circuited to the ground, without affecting matching of the signal with the first frequency band. The effect is illustrated as a curve 23 in FIG. 8.

Figure 7:
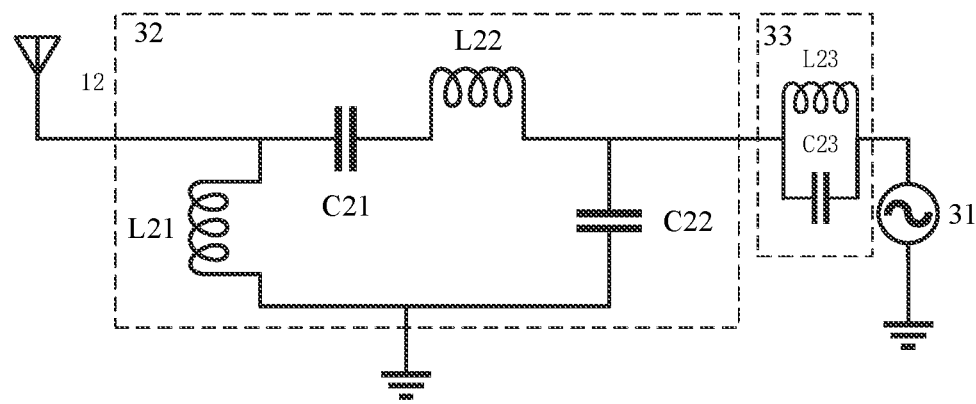
FIG. 7 is a schematic diagram illustrating a filter circuit applicable for a second antenna according to an exemplary embodiment.

Referring to FIG. 7, the second antenna 30 includes a filter circuit 33, which is a band-stop filter. The filter circuit 33 includes a capacitor C23 and an inductor L23. The capacitor C23 is coupled in series between the matching circuit 32 and the signal circuit 31, and the inductor L23 is coupled in series between the matching circuit 32 and the signal circuit 31, which may form a parallel LC resonant circuit. When a capacitance value of the capacitor C23 is greater than 2.5 pF and an inductance value of the inductor L23 is less than 1.5 nH, a resonant frequency of the parallel LC resonant circuit is 2.6 GHz. At the resonant frequency, the parallel LC resonance circuit is equivalent to an open circuit, signals coupled from the first antenna may be stopped without affecting matching of the signal with the second frequency band, and the effect is illustrated as a curve 33 in FIG. 8.

Figure 6:
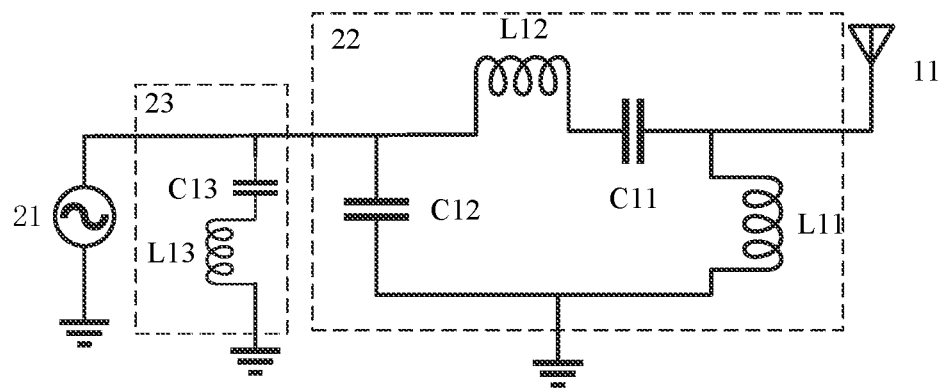
FIG. 6 is a schematic diagram illustrating a filter circuit applicable for a first antenna according to an exemplary embodiment.

It should be noted that when an operating frequency band that the band-pass filter illustrated in FIG. 6 allows signals to pass is overlapped with an operating frequency band that the band-stop filter illustrated in FIG. 7 forbids signals to pass, the isolation degree between the first antenna 20 and the second antenna 30 may be improved, that is, an effect of improving isolation degree of the intersection point illustrated in FIG. 5 may be achieved.

Figure 9:
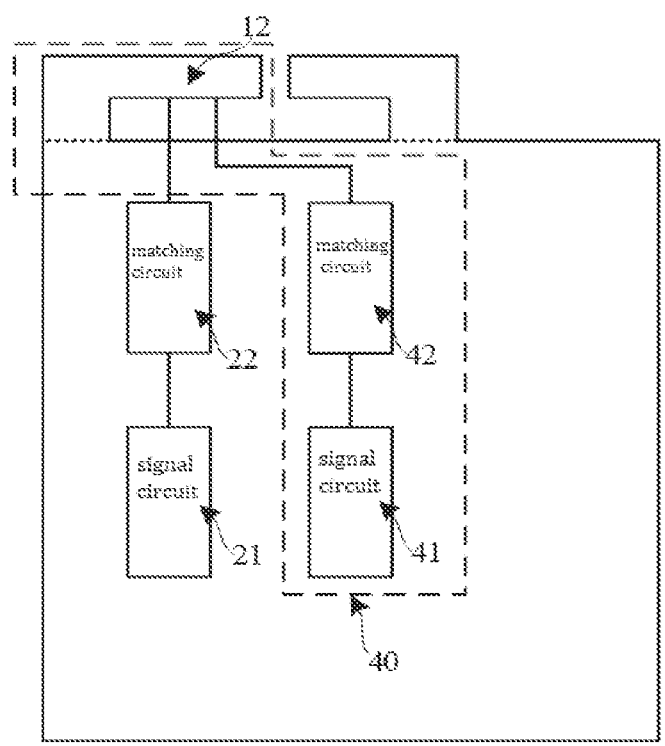
FIG. 9 is a schematic diagram illustrating another structure of an electronic device according to an exemplary embodiment.

In an embodiment, the electronic device further includes a third antenna. The third antenna shares the first frame segment 11 as the radiation structure with the first antenna. Referring to FIG. 9, length of the third antenna 40 is greater than the length of the first antenna 20, that is, the operating frequency of the first antenna 20 is higher than the operating frequency of the third antenna 40. For example, the first antenna 20 is a medium-high frequency antenna, which operates at 1.71 GHz~2.69 GHz; the third antenna 40 is a GPS L5 antenna, which operates at a frequency band of 1.175 GHz. At this time, the third antenna 40 may include a large inductor (for example, an inductance value is greater than 15 nH) coupled in series between the radiation structure and the matching circuit to filter out signals outside the third frequency band, that is, to achieve a purpose of low pass. And/or, the first antenna 20 may include a small capacitor (for example, a capacitance value of which is less than 1 pF) coupled in series between the radiation structure and the matching circuit, or an LC resonant circuit (including an inductor and a capacitor coupled in parallel) coupled in series to filter out signals outside the first frequency band, such as frequencies of GPS L5.

In addition, in order to reduce interaction between the first antenna 20 and the third antenna 40, the first antenna 20 and the third antenna 40 are configured to be not provided with a matching circuit in parallel form or a filter circuit in parallel form, to avoid forming aperture tuning effect. In this embodiment, under a case of without increasing the number of the gap or increasing the number of the gap as little as possible on the frame of the metal housing, at least two antennas may be set on both sides of each gap, thereby improving the use efficiency of each gap, which is conducive to ensuring the strength of the metal structure, and also conducive to meeting the industrial design requirements for appearance, that is, this embodiment may realize a design of double-fed antenna or multi-fed antenna, well capable of meeting requirements of 2/3/4/5G communication, which is conducive to an integration of multi-band and multi-antenna.

Figure 10:
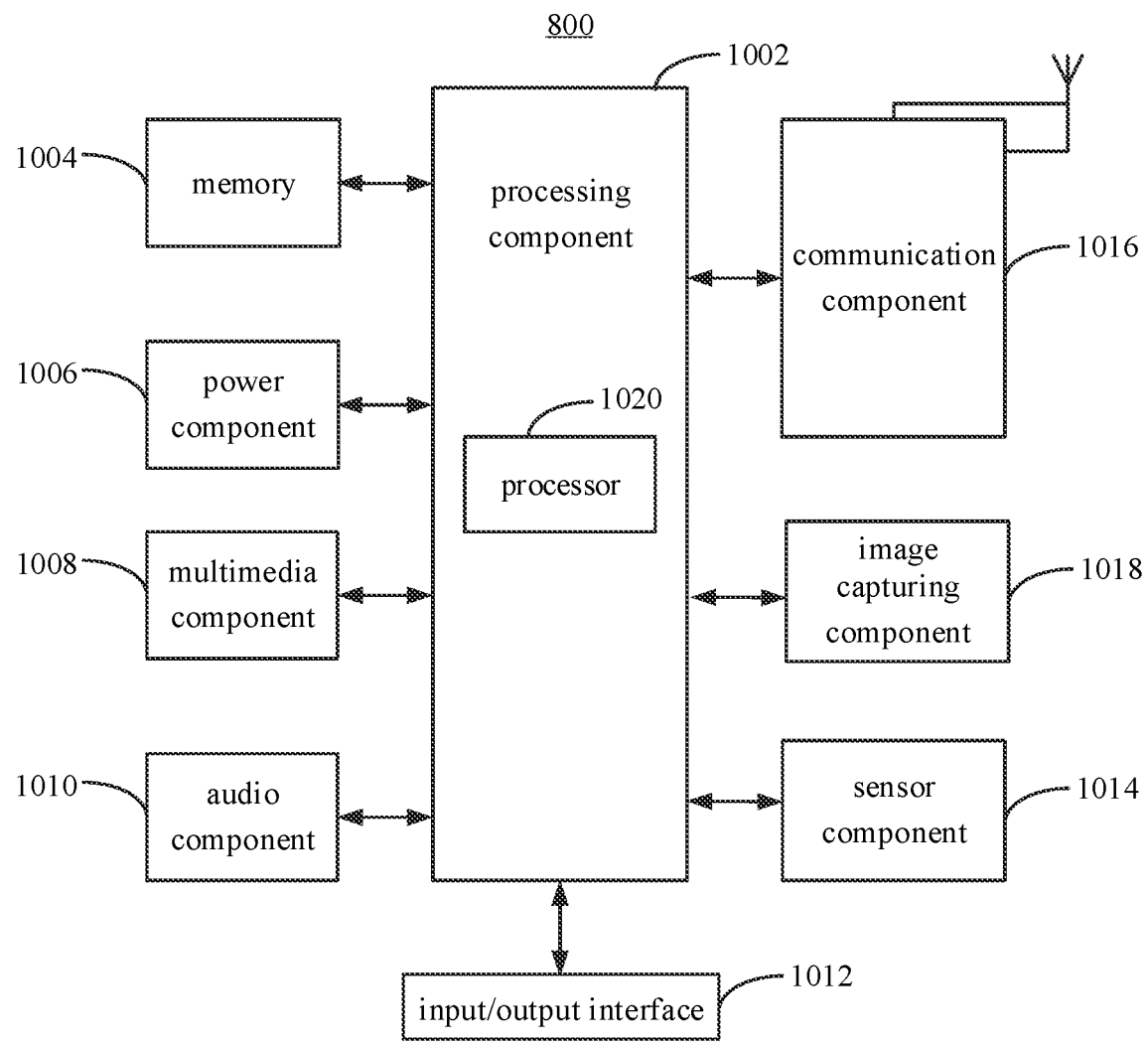
FIG. 10 is a block diagram illustrating an electronic device according to an exemplary embodiment.

FIG. 10 is a block diagram of an electronic device according to an exemplary embodiment of the present disclosure. For example, the electronic device 1000 may be a smartphone, a computer, a digital broadcasting terminal, a tablet device, a medical device, a fitness device, a personal digital assistant, etc.

As illustrated in FIG. 10, the electronic device 1000 may include one or more of the following components: a processing component 1002, a memory 1004, a power component 1006, a multimedia component 1008, an audio component 1010, an input/output (I/O) interface 1012, a sensor component 1014, a communication component 1016 and an image capturing component 1018.

The processing component 1002 typically controls overall operations of the electronic device 1000, such as the operations associated with display, telephone calls, data communications, camera operations, and recording operations. The processing component 1002 may include one or more processors 1020 to execute instructions. Moreover, the processing component 1002 may include one or more modules which facilitate the interaction between the processing component 1002 and other components. For instance, the processing component 1002 may include a multimedia module to facilitate the interaction between the multimedia component 1008 and the processing component 1002.

The memory 1004 is configured to store various types of data to support the operation of the electronic device 1000. Examples of such data include instructions for any applications or methods operated on the electronic device 1000, contact data, phonebook data, messages, pictures, video, etc. The memory 1004 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 1006 provides power to various components of the electronic device 1000. The power component 1006 may include a power management system, one or more power sources, and any other components associated with the generation, management, and distribution of power in the electronic device 1000. The power module 1006 may include a power chip, and the controller may communicate with the power chip, to control the power chip to turn on or turn off switches, to enable a battery to supply power to a motherboard circuit or not.

The multimedia component 1008 includes a screen providing an output interface between the electronic device 1000 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action.

The audio component 1010 is configured to output and/or input audio signals. For example, the audio component 1010 includes a microphone ("MIC") configured to receive an external audio signal when the electronic device 1000 is in an operation mode, such as a call mode, a recording mode, and a voice recognition mode. The received audio signal may be further stored in the memory 1004 or transmitted via the communication component 1016. In some embodiments, the audio component 1010 also includes a speaker for outputting an audio signal.

The I/O interface 1012 provides an interface between the processing component 1002 and peripheral interface modules, such as a keyboard, a click wheel, buttons, and the like.

The sensor component 1014 includes one or more sensors to provide status assessments of various aspects of the electronic device 1000. For instance, the sensor component 614 may detect an open/closed status of the electronic device 1000, relative positioning of components, e.g., the display and the keypad, of the electronic device 1000, a change in position of the electronic device 1000 or a component of the electronic device 1000, a presence or absence of a target object contact with the electronic device 1000, an orientation or an acceleration/deceleration of the electronic device 1000, and a change in temperature of the electronic device 1000.

The communication component 1016 is configured to facilitate communication, wired or wirelessly, between the electronic device 1000 and other devices. The electronic device 1000 can access a wireless network based on a communication standard, such as WiFi, 2G, or 3G, or a combination thereof. In one exemplary embodiment, the communication component 1016 receives a broadcast signal or broadcast associated information from an external broadcast management system via a broadcast channel. In one exemplary embodiment, the communication component 1016 further includes a near field communication (NFC) module to facilitate short-range communications. For example, the NFC module may be implemented based on a radio frequency identity (RFID) technology, an infrared data association (IrDA) technology, an ultra-wideband (UWB) technology, a Bluetooth (BT) technology, and other technologies. In an exemplary embodiment, the communication component 1016 includes a plurality of antennas using the frame as the radiation structure as illustrated in FIGS. 1 to 9.

In exemplary embodiments, the electronic device 1000 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components.

In exemplary embodiments, there is also provided a non-transitory readable storage medium including an executable computer program, such as a memory 1004 including instructions, the above executable computer program may be executed by a processor. For example, the readable storage medium may be a ROM, a RAM, a CD-ROM, a magnetic tape, a floppy disc, an optical data storage device, and the like.

Other embodiments of the present disclosure are obvious for those skilled in the art after considering the description and practicing the disclosure disclosed herein. This disclosure is intended to cover any variations, uses, or adaptive changes that follow the general principles of this disclosure and include common general knowledge or customary technical means in the technical field not disclosed in this disclosure. The description and examples are to be considered exemplary only, and the true scope and spirit of this disclosure are indicated by claims below.

It should be understood that the present disclosure is not limited to the precise structure that has been described above and shown in the drawings, and various modifications and changes may be made without departing from the scope thereof. The scope of the claimed invention is limited only by the appended claims.

What is claimed is:

1. An electronic device, comprising
a metal housing, and
a plurality of antennas operating at different frequency bands,
wherein a frame of the metal housing is provided with at least one gap, each frame segment of frame segments on both sides of each gap is configured as a radiation structure shared by at least one antenna, each antenna comprising a signal circuit and a matching circuit, and wherein the matching circuit is coupled in series between the signal circuit of the antenna where the matching circuit is located and the radiation structure, and configured to output a signal matching with an operating frequency band of the antenna where the matching circuit is located and filter out signals that are coupled from other antennas of the gap and match with operating frequency bands of other antennas of the gap;
wherein, the plurality of antennas comprises a first antenna and a second antenna, each of the first antenna and the second antenna comprises a filter circuit, the filter circuit is coupled in series between the matching circuit and the signal circuit of the antenna where the filter circuit is located, and configured to filter out signals that are coupled from antennas on the other side of the same gap and match with operating frequency bands of antennas on the other side of the same gap and signals that match with operating frequency bands of other antennas on the same side with the antenna where the filter circuit is located.

2. The electronic device according to claim 1, wherein the matching circuit of each antenna is elastically contacted with an electrical contact point on the frame through an elastic sheet, to enable the signal circuit to form an electrical connection with the corresponding frame segment.

3. The electronic device according to claim 2, wherein the number of the electrical contact points on each frame segment is the same with the number of antennas sharing the frame segment as the radiation structure.

4. The electronic device according to claim 1, wherein the matching circuit of the first antenna comprising a first inductor, a second inductor, a first capacitor and a second capacitor; wherein the first inductor is coupled in series between a first terminal of the matching circuit of the first antenna and ground;
the second capacitor is coupled in series between a second terminal of the matching circuit of the first antenna and the ground; the first capacitor is coupled in series between the first terminal of the matching circuit of the first antenna and one terminal of the second inductor, and the other terminal of the second inductor is electrically coupled to the second terminal of the matching circuit of the first antenna.

5. The electronic device according to claim 4, wherein an inductance value of the second inductor is greater than a preset first inductance value, and a capacitance value of the second capacitor is greater than a preset first capacitance value.

6. The electronic device according to claim 4, wherein the second antenna and the first antenna are respectively provided on both sides of the same gap, and an operating frequency of the second antenna is greater than an operating frequency of the first antenna,
the matching circuit of the second antenna comprises a third inductor, a fourth inductor, a third capacitor and a fourth capacitor; the third inductor is coupled in series between the first terminal of the matching circuit of the second antenna and the ground; the fourth capacitor is coupled in series between the second terminal of the matching circuit of the second antenna and the ground; the third capacitor is coupled in series between the first terminal of the matching circuit of the second antenna and one terminal of the fourth inductor, and the other terminal of the fourth inductor is electrically coupled to the second terminal of the matching circuit of the second antenna.

7. The electronic device according to claim 6, wherein an inductance value of the third inductor is less than a preset second inductance value, and a capacitance value of the third capacitor is less than a preset second capacitance value.

8. The electronic device according to claim 6, wherein the second antenna operates at the following frequency bands: N78 (3300 MHz~3800 MHz), N79 (4400 MHz~4900 MHz) or WiFi 5G (550 MHz~850 MHz).

9. The electronic device according to claim 4, wherein, the plurality of antennas further comprises a third antenna sharing a radiation structure with the first antenna,
the third antenna operating at a third frequency band, and a frequency of the third frequency band is less than a frequency of the first frequency band;
the first antenna further comprising a capacitor with a capacitance value less than a preset third capacitance value or a preset LC resonant circuit, the capacitor or the LC resonant circuit is coupled in series between the radiation structure and the matching circuit, and configured to filter out signals outside the first frequency band; and
the third antenna further comprising an inductor with an inductance value greater than a preset third inductance value, the inductor is coupled in series between the radiation structure and a matching circuit, and configured to filter out signals outside the third frequency band.

10. The electronic device according to claim 9, wherein the first antenna and the third antenna are configured to be not provided with a matching circuit in parallel form or a filter circuit in parallel form.

11. The electronic device according to claim 4, wherein the first antenna operates at the following frequency bands: B1/3/7 (1710 MHz~2690 MHz), or GPS (1575.42 MHz)+ 2.4G WiFi (2.4 GHz~2.5 GHz).

12. The electronic device according to claim 1, wherein the filter circuit of the first antenna is implemented by a band-pass filter circuit, the filter circuit of the second antenna is implemented by a band-stop filter circuit, and an operating frequency band that the band-pass filter circuit allows signals to pass is overlapped with an operating frequency band that the band-stop filter circuit forbids signals to pass.

13. The electronic device according to claim 12, wherein the band-stop filter circuit is implemented by a parallel LC resonant circuit; and the band-pass filter circuit is implemented by a series LC resonant circuit.

14. The electronic device according to claim 1, wherein
   the signal circuit is configured to provide a source signal, the source signal is passed through the matching circuit and then forms an electromagnetic signal to radiate into space through the radiation structure; or
   the radiation structure is configured to receive the electromagnetic signal in the space to obtain an electrical signal, and the signal circuit is configured to receive an electrical signal matched by the matching circuit and process the received electrical signal to obtain a signal contained in the electromagnetic signal.

\* \* \* \* \*